Figure 1:
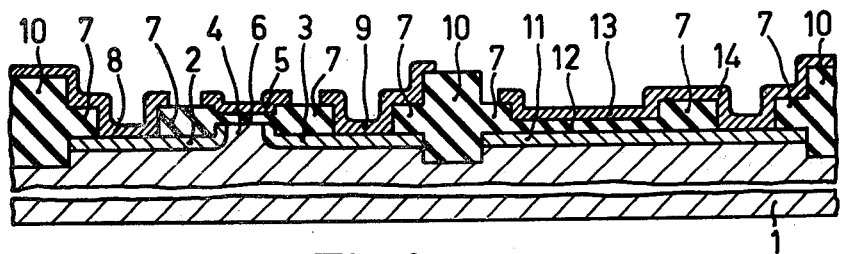

United States Patent [19]

Van Lierop

[11] 3,968,562
[45] July 13, 1976

[54] METHOD OF MANUFACTURING A SEMICONDUCTOR DEVICE

[75] Inventor: Joseph Gijsbertus Van Lierop, Eindhoven, Netherlands

[73] Assignee: U.S. Philips Corporation, New York, N.Y.

[22] Filed: Feb. 11, 1975

[21] Appl. No.: 548,999

Related U.S. Application Data

[62] Division of Ser. No. 304,391, Nov. 7, 1972, abandoned.

[30] Foreign Application Priority Data

Nov. 25, 1971  Netherlands.................. 7116182

[52] U.S. Cl. ................................ 29/571; 29/578; 29/591; 148/1.5; 148/187; 156/3; 156/17; 427/88
[51] Int. Cl.² ............... H01L 21/22; H01L 21/316
[58] Field of Search .............. 156/3, 17; 148/1.5, 148/175, 186, 187; 29/571, 578, 579, 580, 591; 427/85, 93, 88

[56] References Cited
UNITED STATES PATENTS

| | | |
|---|---|---|
| 3,623,217 | 11/1971 | Kawagoe et al. ................... 29/571 |
| 3,676,921 | 7/1972 | Kooi ...................................... 29/571 |
| 3,755,001 | 8/1973 | Kooi et al. ........................... 148/1.5 |
| 3,761,327 | 9/1973 | Harlow et al. ...................... 148/187 |
| 3,899,372 | 8/1975 | Esch et al. ........................... 156/17 |
| 3,909,320 | 9/1975 | Gauge et al. ........................ 148/1.5 |
| 3,923,583 | 12/1975 | Hayaski et al. ..................... 156/378 |

Primary Examiner—Douglas J. Drummond
Assistant Examiner—Jerome W. Massie
Attorney, Agent, or Firm—Frank R. Trifari; Jack Oisher

[57] ABSTRACT

A method of manufacturing semiconductor devices having one or more insulated gate field effect transistors in which a sunken oxide layer is obtained by local oxidation. In those cases in which above a doped zone a thin insulating layer is necessary, for example because said layer forms the dielectric of a capacitor, the invention provides a simplification of the manufacture in that at area in question a thicker sunken oxide layer is first provided which is removed fully or partly in a later stage so as to be able to obtain the desired thinner layer.

7 Claims, 10 Drawing Figures

METHOD OF MANUFACTURING A SEMICONDUCTOR DEVICE

This is a division of application Ser. No. 304,391, filed Nov. 7, 1972, now abandoned.

The invention relates to a method of manufacturing a semiconductor device comprising a semiconductor body having at least two surface zones of one conductivity type which extend in a region of the opposite conductivity type adjoining a surface of the semiconductor body, said surface zones including a source and drain zone of a field effect transistor having at least one insulated gate electrode, in which a masking pattern masking against oxidation is provided on the surface and in which, in a later stage of the manufacture in which impurities to obtain the surface zones have already been provided in the semiconductor body, the semiconductor surface is locally subjected to an oxidation treatment in apertures in the masking pattern to form an insulating oxide layer which is sunken or inset in the semiconductor body at least over a part of its thickness and to cover at least part of at least one of the surface zones by said sunken or inset oxide layer. The invention furthermore relates to semiconductor devices manufactured by using such a method.

As is known, the use of sunken oxide patterns obtained by local oxidation has important advantages in field effect transistors and notably in integrated circuits comprising one or more field effect transistors. For example, in the article entitled "LOCOS DEVICES" in "Philips Research Reports", volume 26, pp. 166-180 are described inter alia a number of structures for field effect transistors in which sunken oxide is used as well as the way in which said structures can be manufactured.

An important advantage of such LOCOS structure is that by using local oxidation the thickness of the insulating layer which covers the semiconductor surface can be adapted in a comparatively simple manner to the properties desired at any particular location. Accordingly, as a thicker insulating layer is desired, the oxidation treatment at the area is continued longer. For example, a thin insulating layer on the channel region of a field effect transistor can be used simply in combination with a comparatively thick insulating layer outside the source and drain zones which is obtained by a longer oxidation treatment, the thick layer being of advantage there in connection with stray capacitances and the possibility of the formation of parasitic channels.

Furthermore, doped zones may also be covered fully or partly with a sunken insulating layer. According to the above-mentioned article, for example, the semiconductor body may first be locally doped after which the oxidation treatment is locally carried out longer or shorter in accordance with the desired thickness of the insulating layer.

It is the object of the invention to provide a new method of manufacturing notably applicable in the manufacture of those structures in which a doped zone, usually an electrode zone of a field effect transistor, is partly covered with a thinner insulating layer and partly covered with a thicker insulating layer or in which doped zones of the same conductivity type occur of which at least one is covered with a thinner and another is covered with a thicker layer, which method can be carried out more simply and/or requires fewer operations.

The invention is inter alia based on the recognition of the fact that this can be achieved by deviating from the conventional method in which a local oxidation treatment is prolonged according as the desirable thickness of the sunken oxide layer is larger and by first providing a thicker layer by local oxidation above the zones of the parts thereof where a thinner layer is desirable.

According to the invention, a method of the type described in the preamble is characterized in that the oxide of a part of the sunken oxide layer present above said one surface zone is locally removed to over at least a part of the thickness of said oxide layer, and a thinner insulating layer is obtained at that same place.

As will be explained in detail hereinafter, certain operations can be combined in this manner to a single operation or a photolithographic operation can be saved or the accuracy with which the alignment of one or more of the photomasks to be used for the required photolithographic operations has to be carried out, can be reduced. All these advantages result to a greater or smaller extent in an increase of the yield of the manufacture and/or a decrease of the semiconductor surface is required for the field effect transistor and/or an improvement of the electrical properties of the device.

The removal of the oxide can simply be continued until the remaining part of the oxide layer has the desired thickness.

Preferably, however, the oxide is removed throughout the thickness of the sunken oxide layer and a fresh thinner insulating layer is provided at that area, for example, by oxidation and/or by deposition from the gaseous phase. This has the advantage that the desired thickness can usually be realized with a greater accuracy and also that, if desirable, other insulating materials or insulating layers of different materials can be used, for example, silicon nitride or double layers of silicon nitride and silicon oxide.

The thinner insulating layer can often be provided simultaneously with the layers required between the gate electrode and the channel region of a field effect transistor which serves to isolate said gate electrode.

In an important embodiment of the method according to the invention a part of the sunken oxide layer present above said one surface zone is maintained substantially throughout its thickness and adjoining the place where oxide is removed. By only locally removing the part of the sunken oxide layer present on said one surface zone, the advantages, or at least a part thereof, associated generally with the use of sunken oxide layers are maintained while only a thinner insulating layer is present in the desired place. A part of the inset insulating layer can often be maintained advantageously in particular at the edge of said one surface zone where the p-n junction between said zone and the adjoining region terminates at the semiconductor surface, or in the immediate proximity of said edge. In a field effect transistor, the sunken oxide layer may be maintained, for example, on that part of the edge of the source and/or the drain region which adjoins the channel region.

The oxide is preferably removed while using a masking layer which is provided at the surface and has an aperture which leaves the part of the sunken oxide layer present above said one surface zone only partly uncovered.

In a further important embodiment of the method according to the invention at least a part of the resulting thinner insulating layer is covered with a conductive layer. Said conductive layer, for example, together with said one surface zone and the intermediate thinner insulating layer constitutes a capacity which is connected directly on one side with the source or drain zone of a field effect transistor.

The field effect transistor is preferably provided with an insulated gate electrode connected electrically to the conductive layer, in parallel if the one surface zone constitutes one of the electrode zones of the field effect transistor. The structure obtained in this manner is particularly compact and constitutes a field effect transistor having a built-in capacitance between the gate electrode and, for example, the drain zone. Such field effect transistors can be used, for example, as Miller integrators or may be used, for example, in capacitor memories. In most of these applications the capacity between the gate electrode and the source zone must be as small as possible. As is known, field effect transistors having a comparatively small capacitance between the gate electrode and the semiconductor zones of the source and drain electrode can be obtained by using a sunken oxide. When using the method according to the invention, first a field effect transistor with inset oxide and the associated low parasitic capacitances is provided after which the inset oxide is fully or partly removed on the side of the drain zone so as to obtain a desired thin dielectric for the capacitor. On the side of the source zone, the resulting low value of the parasitic capacitance between the source zone and the gate electrode is maintained.

The invention will now be described in greater detail with reference to a few examples and the accompanying drawing, in which FIG. 1 is a diagrammatic sectional view of a part of a first semiconductor device manufactured by using the method according to the invention, while FIGS. 2 to 5 are diagrammatic cross-sectional views of the semiconductor device shown in FIG. 1 in various stages of manufacture.

Figure 6A:
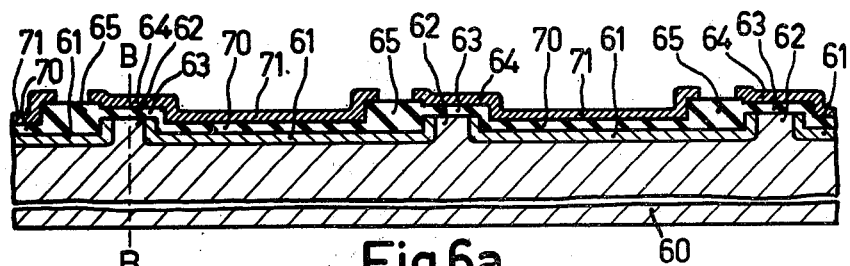
Figure 6B:
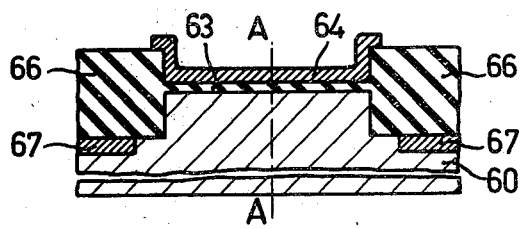
Figure 7:
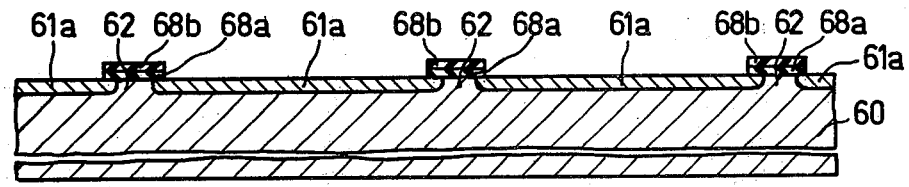
Figure 8:
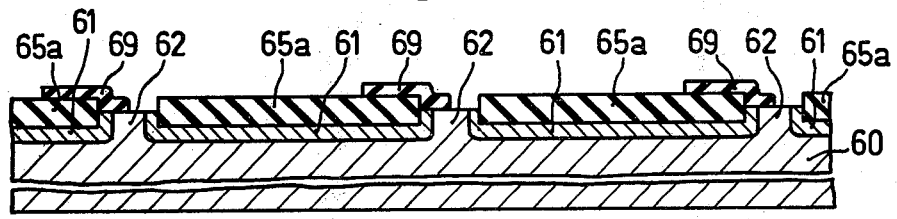
Figure 9:
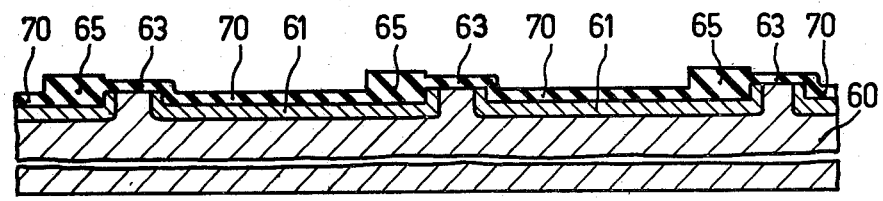

FIGS. 6a and 6b are each diagrammatic cross-sectional views of a part of a second semiconductor device which is manufactured by using the method according to the invention, in which FIGS. 7, 8 and 9 are diagrammatic cross-sectional views of the semiconductor device shown in FIGS. 6a and 6b in various stages of the manufacture.

The first example relates to a semiconductor device comprising an insulated gate field effect transistor and a capacitance. These two circuit elements constitute, for example, a part of an integrated circuit having a semiconductor body 1 (FIG. 1) which may comprise further circuit elements.

The field effect transistor has two surface zones 2 and 3 of a conductivity type opposite to that of the adjoining part of the semiconductor body 1. These surface zones 2 and 3 constitute the source and drain zones, respectively, between which a channel region 4 extends which adjoins the semiconductor surface. During operation the current passage from the source zone to the drain zone can be controlled by means of a control electrode which is present above the channel region 4 and which is constituted by a conductive layer 5. Said conductive layer 5 is isolated from the channel region by a thin insulating layer 6. Furthermore, parts of a thicker insulating layer 7 which is provided with apertures in which conductive connections 8 and 9 for the source and drain zones 2 and 3 are provided, are present above the source and drain zones 2 and 3, respectively, said connections extending from the apertures further over the insulating layer 7, 10. In the present example a part 10 of the insulating layer is used which is thicker than the part 7 and which bounds and surrounds the semiconductor surface area which is occupied by the source and drain zones 2 and 3 and the channel region 4 of the field effect transistor. However, the insulating layer 7, 10 may also consist of a layer having a substantially uniform thickness instead of parts of different thicknesses.

The capacitance is formed by a surface zone 11 of the same conductivity type as the zones 2 and 3, a thin insulating layer 12 present above the zone 11 and a conductive layer 13 which is isolated from the zone 11 by the layer 12 and which also constitutes one of the electric connections of the capacitance. A conductive layer 14 which is connected to the zone 11 via an aperture in the insulating layer 7 serves as a second connection of the capacitance. The part of the semiconductor surface occupied by the zone 11 is also bounded and surrounded by the thick insulating layer 10.

Starting material in manufacturing the semiconductor device shown in FIG. 1 may be a semiconductor body 1' (FIG. 2) of which at least a part adjoining a surface 15 of a given conductivity type. In the present example the whole body consists of n-type silicon which has a resistivity, for example, of approximately 5 Ohm.cm. The broken line 16 in FIG. 2 denotes that the body 1' may also consist, for example, of a low-ohmic substrate 17 on which an epitaxial layer 18 having a higher resistivity is provided.

Figure 2:
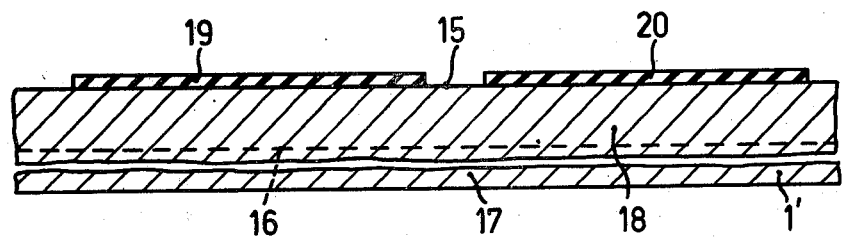
Figure 3:
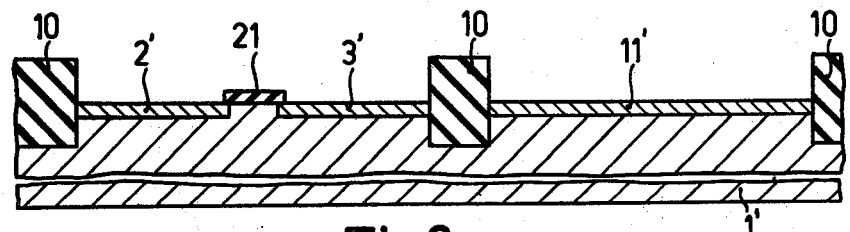
Figure 4:
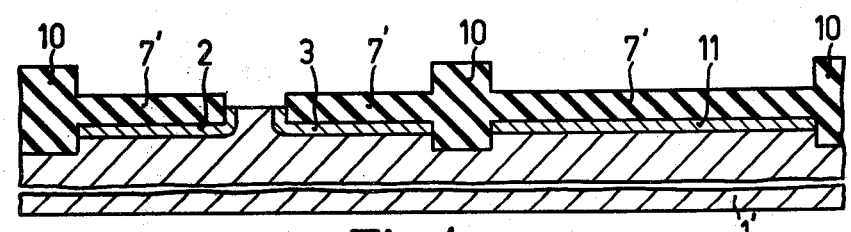
Figure 5:
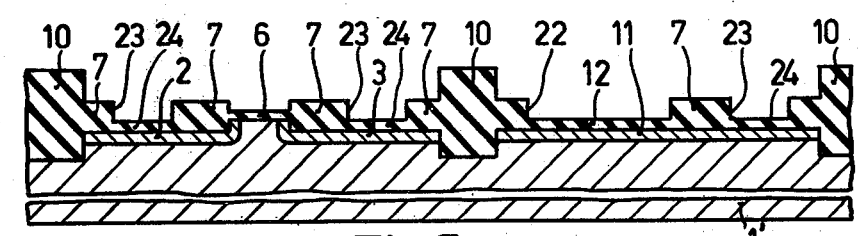

A masking pattern 19, 20 masking against oxidation is provided on the surface 15 and consists, for example, of a layer of silicon nitride. The parts 19 and 20 of the masking layer shown in FIG. 2 are spaced from each other and are entirely separated from each other.

An insulating layer 10 (FIG. 3) which is sunken in the semiconductor body 1' at least over a part of its thickness is provided in the usual manner by heating in an oxidizing atmosphere. If desired grooves may be provided in the semiconductor body, for example by means of an etching treatment, at the area of the non-masked parts of the semiconductor surface 15 and preceding the oxidation treatment. Said grooves are filled with oxide during the oxidation treatment. In accordance with the depth of the provided grooves, which may be, for example, 1 $\mu$m, the insulating layer 10 is inset in the semiconductor body to a greater or smaller extent. As is known, it may be of advantage, in particular when using particularly thick sunken insulating layers, to reduce in this manner the height of the unevenesses in the upper surface of the planar structure and thus avoided difficulties which might otherwise occur upon metallisation.

The greater part of the part 19 of the masking pattern is now removed and only the ultimate channel region 4 of the transistor remains covered by the remaining masking layer 21. Impurities to form the source and drain zones 2 and 3 are then provided in the semiconductor body 1', the p-type regions 2' and 3' being formed, for example, by diffusion or ion implantation. Boron may be used, for example, as an acceptor impurity.

The semiconductor body 1' is again heated in an oxidizing atmosphere, in which the semiconductor surface is locally oxidized in apertures in the masking pattern 21 and a second inset insulating layer 7' is formed. At the same time, the introduced acceptors diffuse further into the semiconductor boody 1', the zones 2 and 3 being formed which are substantially entirely covered by the sunken insulating layer 7'.

The part 20 (FIG. 2) of the masking layer 19, 20 could then be removed, after which, for example, the surface zone 11 of the capacitance can be provided by diffusion or ion implantation. During or after said diffusion treatment the zone 11 may be covered with a thin insulating layer.

In the present example, however, the masking part 20 is removed simultaneously with the greater part of the masking part 19 and a region 11' (FIG. 3) is also formed simultaneously with the regions 2' and 3'. During the subsequent oxidation treatment the zone 11 of the capacitance is also obtained according to the invention simultaneously with the zones 2 and 3, which zone 11 is covered by part of the inset insulating layer 7' just as the zones 2 and 3.

It will be obvious that in this manner a photo etching and a diffusion treatment are saved.

At the area where the thin insulating layer 12 is necessary for the capacitance, a part of the sunken insulating layer 7' can be removed locally, which treatment may be continued until the thickness of the layer 7' has reduced to the desired value. In the present example, an aperture 22 (FIG. 5) is etched in the layer 7', the oxide in the aperture 22 being removed entirely. Apertures 23 are simultaneously provided in the layer 7' for contacting the zones 2, 3 and 11. The apertures 23, however, may also be obtained in a later stage, after providing the thin insulating layer 12 in the aperture 22.

The part 21 of the masking layer may be maintained as an insulation between the gate electrode and the channel region or, as in the example, be removed prior to or after providing the apertures 22 and 23.

Thin oxide layers 6 and 12 are then provided above the channel region 4 and above a part of the zone 11, respectively, by thermal oxidation, a thin layer 24 being simultaneously obtained in the apertures 23. An alternative is, for instance to cover the entire upper surface of the device with a thin insulating layer which consists, for example, of silicon nitride and/or silicon oxide by sputtering or by deposition from the gaseous phase by means of a chemical reaction.

After removing the thin insulating layer 24 from the apertures 23, the gate electrode 5, the electrode 13 of the capacitance and the connections 8, 9 and 14 may be provided, for example, by vapour deposition or sputtering and then patterned a metal layer for which may be used, for example, aluminum or molybdenum. The resulting device is shown in FIG. 1.

A second embodiment relates to an integrated capacitor memory or charge transfer device of the type as described in the Dutch patent application No. 6,805,705. This memory comprises a series of field effect transistors in which a memory capacitance is present between the gate electrode and the drain electrode of at least a number of the field effect transistors. The said memory capacitances may be formed by a conductive layer which is connected to the gate electrode in question and which extends above but is isolated from the drain electrode zone in question.

FIGS. 6a and 6b are two cross-sectional views of a part of said integrated circuit which relate to two mutually perpendicular directions. The dot-and-dash lines B and A in FIG. 6a and FIG. 6b, respectively, denote the plate which corresponds to the cross-section of FIG. 6b and FIG. 6a, respectively.

FIG. 6a shows a series of field effect transistors having a series of electrode zones 61 which each constitute simultaneously the drain zone of a field effect transistor of the series and also the source zone of the succeeding field effect transistor. Each of zones 61 also constitutes one of the electrodes of a memory capacitance 61, 70, 71.

The surface zones 61 are provided in a region 60 of the opposite conductivity type which in this case also constitutes the substrate of the integrated circuit. Furthermore each of the field effect transistors has a channel region 62 and a gate electrode 64 isolated therefrom by a thin insulating layer 63.

In particular when such memories are destined for use at comparatively high frequencies, the value of the stray capacitance between the gate electrode and the source zone may be extremely important because it has a detrimental influence on the speed of the memory. Actually the stray capacitance must be charged and discharged, respectively, simultaneously with the memory capacity, while in addition, with the clock voltage at the gate electrode remaining the same, the value of the control voltage between the gate electrode and the source zone is reduced by the presence of the stray capacitance. This means inter alia that when the field effect transistor is switched to the conductive condition the transistor becomes conductive less rapidly and also to a smaller extent. Finally, the stray capacitance in question also has a detrimental influence on the maximum signal value permissible with a given clock voltage.

In order to restrict the value of said parasitic capacitance a comparatively thick insulating layer 65 is preferably used above the source zone at the edge thereof adjoining the channel region 62, which layer in the embodiment shown is constructed as an inset insulating layer 65.

This example furthermore uses the possibility as indicated in the above-mentioned article "LOCOS DEVICES" of using field effect transistors having an n-type channel in integrated circuits. As is known, such transistors are faster than the field effect transistors having a p-type channel and which are more usual in integrated circuits. This higher speed of the transistors has a favourable influence on the maximum permissible clock pulse frequency of the capacitor memory.

The use of the method according to the invention results in this case in a comparatively simple method of manufacturing and in comparatively small parasitic capacitances between the gate electrodes and the source zone.

Starting material is a p-type silicon substrate 60 having a resistivity of, for example, approximately 3 Ohm.cm. This resistivity may be chosen, for example, in the range from 1 to 10 Ohm.cm, the value chosen also determining whether the field effect transistors are of the enhancement or of the depletion type, said value moreover influencing the value of the capacitances between the electrode zones and the substrate. At the area where the field effect transistors arranged in rows have to be provided, a masking layer consisting of strips is provided on a surface of the substrate, each of the said strips covering the place of a row of transistors. The masking layer consists in this case of a double layer comprising a thin silicon oxide layer which is present on the semiconductor surface and which in turn is covered by a layer of silicon nitride.

In the manner described in the article "LOCOS DEVICES" the sunken oxide pattern 66 above underlying p-type zones 67 as shown in FIG. 6b is then provided by a diffusion and local oxidation. These zones 67 are more highly doped than the p-type substrate 60 and reduce the possibility of parasitic channel formation.

The cross-sectional view of FIG. 7 corresponding to FIG. 6a shows the device after the greater part of the masking double layer has been removed, so that of said layer only parts 68a, b are present at the area of the ultimate channel regions 62 of the transistors and after donors have been provided in the regions 61a to obtain the electrode zones 61.

During the subsequent oxidation treatment, the electrode zones 61 and the sunken insulating layer 65a covering said zone substantially entirely are formed (FIG. 8).

The parts 68a, b of the masking layer may be maintained as an isolation for the gate electrode 64 or be removed as in this example. Prior to or after said removal, the greater part of the sunken insulating layer 65a is again removed while using a mask 69 (FIG. 8). Only the parts 65 on the side of the source zone substantially adjoining the channel region 62 are maintained.

It is to be noted that the accuracy with which the mask 69 is positioned only influences the accuracy of the capacitance value of the memory capacitance, which accuracy need usually not to be very large and moreover does not influence the value of the parasitic capacitance between the gate electrode and the source zone.

If the accuracy of the resulting capacitance value of the memory capacitance is of importance indeed, a part of the sunken insulating layer 65a is preferably also maintained on the side of the drain zone. In that case the structure of the memory capacitance is comparable to the capacitance 11, 12, 13 shown in FIG. 1 in which the size of the aperture 22 (FIG. 5) and hence the value of the capacitance is determined by a single mask and not by the positioning of a mask relative to the structure already present.

A subsequent operation consists in providing the thin insulating layer 63, 70 above the channel region 62 and the part of the electrode zone 61 forming part of the memory capacitance. This layer 63, 70 can be obtained, for example, by thermal oxidation or by deposition.

After providing conductive layers 64, 71 on the surface of the device is a usual manner, the structure shown in FIGS. 6a and 6b is obtained.

It will be obvious that the present invention is not restricted to the embodiments described but that many variations are possible to those skilled in the art without departing from the scope of the invention. For example, other semiconductor materials, for example silicon carbide, may be used. The conductive layers may be manufactured from other suitable metals or from multiple layers, for example, polycrystalline silicon may be used or the conductive layers may consist of successive layers of, for example, titanium, platinum and gold. The part of the inset insulating layer to be removed need furthermore not be present entirely above a doped zone. If the doped zone lies entirely below the sunken insulating layer, so that also the intersection of the pn junction bounding said zone and the semiconductor surface is covered by the sunken layer, as is the case, for example, with the zone 67 in FIG. 6b, the ultimately obtained thinner insulating layer may also extend to beyond the surface parts bounded by the doped zone. This latter may of course hold also for a conductive layer possibly to be provided on the thinner insulating layer.

The thinner insulating layer may also extend only in a part of the aperture made in the sunken insulating layer. For example, instead of the part of the sunken insulating layer 7 which in FIG. 1 is present above the zone 11 and between the conductive layers 13 and 14, a part having the same thickness as the insulating layer 12 may be used. Instead of the two apertures 22 and 23 present above the zone 11 a single aperture will do. In that case the part of the sunken layer 7 present above the zone 11 may also be removed, for example, down to the boundary formed by the sunken layer 10.

Instead of the connection 71 (FIG. 6a) of the capacitance being connected to the gate electrode 64, as a result of which the capacitance is connected between the drain zone and the gate electrode, the connection 71 in other applications than the described capacitor memory may, for example, also be connected to the substrate 60 in which case the capacitance is parallel to the diode capacitance between the electrode zone 61 and the substrate 60.

The conductive layer 13 present above the thinner layer 12 may, for example, also be a transparent electrode and furthermore, dependent upon the application in view, other layers may be provided between the thinner insulating layer and the conductive layer. In general, the layer present above the doped zone may differ from the originally provided sunken insulating layer as regards a smaller thickness and/or a different composition of materials.

What is claimed is:

1. A method of manufacturing a semiconductor device containing a plurality of field effect transistors comprising a semiconductor body, each of said field effect transistors comprising two spaced surface zones of one conductivity type which extend in a region of the opposite conductivity type adjoining a surface of the semiconductor body, said surface zones constituting source and drain zones of the field effect transistor having at least one insulated gate electrode and defining in the opposite type region under the gate electrode a channel region wherein carriers can be caused to flow from source to drain, comprising providing an oxidation masking pattern which includes a material other than a semiconductor oxide over at least the channel region and introducing impurities into the semiconductor body to form the said surface source and drain zones, selectively oxidizing the semiconductor surface in apertures in the oxidation masking the pattern to form a thick patterned oxide layer inset in the semiconductor body at least over a part of its thickness and covering at least part of each of the said source and drain zones, thereafter forming a thinner section of the inset oxide layer present above at least part of said drain zone by removing part of the inset oxide layer thickness, forming a conductive layer on the surface of at least part of the thinner section of the inset oxide layer to serve as an electrode of a capacitance whose other electrode is formed by the drain zone whereby the capacitance is maximized, forming a conductive layer over the channel to constitute a gate electrode, said gate electrode being formed to extend over a portion of the thick oxide layer remaining on the said source zone whereby source-gate overlap capacitance is minimized, and making connections to the field effect transistors and capacitors.

2. A method as claimed in claim 1, wherein the gate electrode is connected to the capacitance electrode.

3. A method as claimed in claim 1, wherein a part of the inset oxide layer present above said one surface zone and adjoining the thinner section where the oxide is removed is maintained substantially throughout its thickness.

4. A method as claimed in claim 3 wherein to remove the oxide a masking layer is provided having an aperture which leaves the part of the inset oxide layer present above said one surface zone only partly uncovered.

5. A method of manufacturing a semiconductor device containing a plurality of field effect transitors comprising a semiconductor body, each of said field effect transistors comprising two spaced surface zones of one conductivity type which extend in a region of the opposite conductivity type adjoining a surface of the semiconductor body, said surface zones constituting source and drain zones of the field effect transistor having at least one insulated gate electrode and defining in the opposite type region under the gate electrode a channel region wherein carriers can be caused to flow from source to drain, comprising providing an oxidation masking pattern which includes a material other than a semiconductor oxide over at least the channel region and introducing impurities into the semiconductor body to form the said surface source and drain zones, selectively oxidizing the semiconductor surface in apertures in the oxidation masking pattern to form a thick patterned oxide layer inset in the semiconductor body at least over a part of its thickness and covering at least part of each of the said source and drain zones, thereafter forming a thinner section of the inset oxide layer present above at least part of said drain zone by removing the entire thickness of that section of the inset layer and thereafter forming a fresh thinner insulating layer at the area, forming a conductive layer on the surface of at least part of the thinner section of the inset oxide layer to serve as an electrode of a capacitance whose other electrode is formed by the drain zone whereby the capacitance is maximized, forming a conductive layer over the channel to constitute a gate electrode, said gate electrode being formed to extend over a portion of the thick oxide layer remaining on the said source zone whereby source-gate overlap capacitance is minimized, and making connections to the field effect transistors and capacitors.

6. A method as claimed in claim 5, wherein a layer serving to isolate the gate electrode of the field effect transistor is provided simultaneously with the thinner insulating layer.

7. A method as claimed in claim 5 wherein the gate electrode is connected to the capacitance electrode.

* * * * *